United States Patent
Kim et al.

(10) Patent No.: US 7,482,066 B2
(45) Date of Patent: Jan. 27, 2009

(54) LIGHT-EMITTING POLYMER COMPOSITION AND ORGANIC EL DISPLAY DEVICE USING THE SAME

(75) Inventors: Mu-Hyun Kim, Suwon (KR); Jang-Hyuk Kwon, Suwon (KR); Min-Chul Suh, Sungnam (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 0 days.

(21) Appl. No.: 10/172,001

(22) Filed: Jun. 17, 2002

(65) Prior Publication Data

US 2003/0085653 A1    May 8, 2003

(30) Foreign Application Priority Data

Oct. 29, 2001    (KR) ............................... 2001-66880

(51) Int. Cl.
  *H01J 1/62*    (2006.01)
  *C09K 11/06*   (2006.01)
(52) U.S. Cl. .................. 428/690; 428/917; 313/504; 313/506; 257/40; 257/103; 257/301.16; 257/301.35; 257/E51.01
(58) Field of Classification Search .................. 428/690, 428/917; 257/40, 102, 103, E51.03, E51.051; 313/504, 506; 252/301.16, 301.35
See application file for complete search history.

(56) References Cited

U.S. PATENT DOCUMENTS

| | | | | |
|---|---|---|---|---|
| 5,663,573 A * | 9/1997 | Epstein et al. | ............... | 257/40 |
| 5,945,502 A * | 8/1999 | Hsieh et al. | ............... | 528/101 |
| 5,952,778 A * | 9/1999 | Haskal et al. | ............... | 313/504 |
| 6,111,356 A * | 8/2000 | Roitman et al. | ............. | 313/506 |
| 6,163,163 A * | 12/2000 | Kohn et al. | ................. | 324/765 |
| 6,169,163 B1 * | 1/2001 | Woo et al. | ................... | 528/397 |
| 6,235,414 B1 * | 5/2001 | Epstein et al. | ............. | 428/690 |
| 6,372,154 B1 * | 4/2002 | Li | ........................ | 252/301.16 |
| 6,384,528 B1 * | 5/2002 | Friend et al. | ................ | 313/504 |
| 6,416,885 B1 * | 7/2002 | Towns et al. | ................ | 428/690 |
| 6,626,722 B2 * | 9/2003 | Takematsu et al. | ........... | 445/24 |
| 6,833,283 B2 * | 12/2004 | Epstein et al. | ............... | 438/82 |
| 2001/0053462 A1 * | 12/2001 | Mishima | .................... | 428/690 |

FOREIGN PATENT DOCUMENTS

JP    11-040358    2/1999
KR    1999-13883    2/1999

OTHER PUBLICATIONS

Kang et al., "Yellow Light Emitting Fluorine Substituted PPV Derivative", 1997, Chemical Materials vol. 9, pp. 746-749.*
Office Action issued in Korean Patent Application No. 2001-66880 on Jul. 31, 2004.
U.S. Appl. No. 11/011,588, filed Dec. 15, 2004, Mu-Hyun Kim et al., Samsung SDI Co., Ltd.
U.S. Appl. No. 11/011,587, filed Dec. 15, 2004, Mu-Hyun Kim et al., Samsung SDI Co., Ltd.

* cited by examiner

*Primary Examiner*—Rena L Dye
*Assistant Examiner*—Camie S Thompson
(74) *Attorney, Agent, or Firm*—Stein, McEwen & Bui, LLP

(57) ABSTRACT

A light-emitting polymer composition for a light-emitting layer in an organic EL display device includes at least first and second light-emitting polymers having different interfacial characteristics which lower a cohesion between elements of the first and second light-emitting polymers.

18 Claims, 4 Drawing Sheets

LIGHT-EMITTING POLYMER COMPOSITION AND ORGANIC EL DISPLAY DEVICE USING THE SAME

CROSS-REFERENCE TO RELATED APPLICATIONS

This application claims the benefit of Korean Patent Application No. 2001-66880 filed on Oct. 29, 2001, in the Korean Industrial Property Office, the disclosure of which is incorporated herein by reference.

BACKGROUND OF THE INVENTION

1. Field of the Invention

The present invention relates to a light-emitting polymer composition and an organic electroluminescent (EL) display device using the same.

2. Description of the Related Art

An organic EL display device includes an anode, a hole injection layer, a hole transportation layer, a light-emitting layer, an electron transporting layer, an electron injection layer, and a cathode, which are sequentially stacked on a substrate.

The above-described layers of the organic EL display device are made of a small molecular organic material or a high-molecular organic material (i.e., a polymer). The layers of the organic EL display device comprising a small molecular organic material are formed by, for example, a vacuum deposition technique, while the layers of the organic EL display comprising a high-molecular organic material are formed by, for example, a spin coating technique.

In general, an organic EL display device having a light-emitting layer of one color made of a high-molecular organic material is easy to manufacture and is lower in driving voltage than that of a small molecular organic material. However, an organic EL display device having a light-emitting layer of one color made of the high-molecular organic material is lower in light-emitting efficiency and shorter in life span than that of the small molecular organic material.

On the other hand, in forming a light-emitting layer of a full color, an organic EL display device having the high-molecular organic material has difficulties in patterning red, green and blue light-emitting layers using an ink jet technique or a laser transfer technique, leading to a low light-emitting efficiency and a short life span.

Conventional light-emitting polymer materials are patterned by the ink-jet technique or the laser transfer technique. However, in most cases, light-emitting polymer materials are not transferred using the laser transfer technique, which is a kind of a thermal transfer technique.

The thermal transfer technique requires at least a light source, a transfer film, and a substrate. Light emitted from the light source is absorbed into a light absorbing layer of the transfer film and then converted into heat energy. An image forming material of the transfer film is transferred to the substrate by the heat energy, thereby forming a desired image on the substrate. The thermal transfer technique is also used to form a color filter of a liquid crystal display (LCD) device.

FIG. 1 shows a schematic view illustrating a laser transfer operation for patterning a light-emitting layer of a conventional organic EL display device.

Referring to FIG. 1, an organic film $S_2$ is formed on a substrate $S_1$. A laser beam is irradiated to the substrate $S_1$ to separate the organic film $S_2$ from the substrate $S_1$ and transfer it to a substrate $S_3$.

Here, parameters that determine a transfer characteristic include an adhesion $W_{12}$ between the substrate $S_1$ and the organic film $S_2$, a cohesion $W_{22}$ between elements of the organic films $S_2$, and an adhesion $W_{23}$ between the organic film $S_2$ and the substrate $S_3$.

The adhesion $W_{12}$ and $W_{23}$ and the cohesion $W_{22}$ can be described by a surface tension and an interfacial tension as follows:

$W_{12} = \gamma_1 + \gamma_2 - \gamma_{12}$;

$W_{22} = 2\gamma_{22}$; and $W_{23} = \gamma_2 + \gamma_3 - \gamma_{23}$, where $\gamma_1$ denotes a surface tension of the substrate $S_1$, $\gamma_2$ denotes a surface tension of the organic film $S_2$, $\gamma_3$ denotes a surface tension of the substrate $S_3$, $\gamma_{12}$ denotes an interfacial tension between the substrate $S_1$ and the substrate $S_2$, $\gamma_{22}$ denotes an interfacial tension between the elements of the organic film $S_2$ and $\gamma_{23}$ denotes an interfacial tension between the substrate $S_2$ and the substrate $S_3$.

As the cohesion between the elements of the organic film $S_2$ becomes smaller than the adhesion between the respective substrates $S_1$ and $S_3$ and the organic film $S_2$, the laser transfer characteristic improves.

However, a lighting-emitting layer of the conventional organic EL display device is usually made of a polymer film which has a high molecular weight. Therefore, the cohesion between elements of the polymer film is relatively large. Accordingly, the polymer film shows a bad transfer characteristic in the conventional organic EL display device.

That is, the conventional art does not disclose a technique that can improve a transfer characteristic where the light-emitting layer is formed using the laser transfer technique.

SUMMARY OF THE INVENTION

Accordingly, it is an object of the present invention to provide a light-emitting polymer composition which can improve a transfer characteristic where a light-emitting layer of an organic EL display device is formed using a laser transfer technique.

It is another object of the present invention to provide a light-emitting polymer composition which can improve a light-emitting efficiency of an organic EL display device.

Additional objects and advantages of the invention will be set forth in part in the description which follows and, in part, will be obvious from the description, or may be learned by practice of the invention.

To achieve the above and other objects of the present invention, there is provided a light-emitting polymer composition for a light-emitting layer in an organic EL display, comprising at least first and second light-emitting polymers having elements, wherein the first and second light-emitting polymers have different interfacial characteristics which lower a cohesion between the elements of the first and second light-emitting polymers, and a corresponding wavelength spectrum of the first light-emitting polymer overlaps a corresponding wavelength spectrum of the second light-emitting polymer, so as to have an energy transfer in the light-emitting polymer composition.

The light-emitting polymer composition further includes an additive which improves adhesion of the light-emitting composition to a substrate and lowers the cohesion between the elements of the first and second light-emitting polymers. The additive is "optically inert." That is, the addition of the additive to the light-emitting polymer composition does not affect a final emitting spectrum and a color index of the light-emitting polymer composition in a range of visible light region of 400 nm to 800 nm, wherein the range is a emitting light region of the light-emitting polymer composition.

The additive is one of an optically inert polymer, an optically inert small molecular material, a polymer having a carrier transporting ability, and a small molecular material having a carrier transporting ability.

The optically inert polymer is selected from a group consisting of a polystyrene, a poly(styrene-butadione) copolymer, a polymethylmethacrylate, a polyalphamethylstyrene, a styrene-methylmethacrylate copolymer, a polybutadiene, a polycarbonate, a polyethyleneterephthalate, a polyestersulfonate, a polysulfonate, a polyarylate, a fluorinepolyimide, a transparent fluoric resin, and a transparent acrylic resin.

The polymer having the carrier transporting ability is selected from a group consisting of an arylamine, a perylrene group and a pyrrole-based polymer. The small molecular material having the carrier transporting ability is, for example, an arylamine, a hydrazone, a carbazole, a stylbene, a staburst group, and an oxadiazole. A mixing mass ratio of the first light-emitting polymer is in a range between 0.3 and 0.8, and a mixing mass ratio of the second light-emitting polymer is in a range between 0.2 and 0.7. A mixing mass ratio of the additive is less than 0.7.

To achieve the above and other objects according to another aspect of the present invention, there is provided a light-emitting polymer composition for a light-emitting layer of an organic EL display, comprising a light-emitting polymer having elements and an additive which improves adhesion of the light-emitting composition to a substrate of the organic EL display, and lowers a cohesion between the elements of the light-emitting polymers.

The additive is one of an optically inert polymer, an optically inert small molecular material, a polymer having a carrier transporting ability, and a small molecular material having a carrier transporting ability.

The optically inert polymer is selected from a group consisting of a polystyrene, a poly(styrene-butadione) copolymer, a polymethylmethacrylate, a polyalphamethylstyrene, a styrene-methylmethacrylate copolymer, a polybutadiene, a polycarbonate, a polyethyleneterephthalate, a polyestersulfonate, a polysulfonate, a polyarylate, a fluorinepolyimide, a transparent fluoric resin, and a transparent acrylic resin.

The polymer having the carrier transporting ability is selected from a group consisting of an arylamine, a perylrene group and a pyrrole-based polymer. The small molecular material having the carrier transporting ability is, for example, an arylamine, a hydrazone, a carbazole, a stylbene, a staburst group, and an oxadiazole. A mixing mass ratio of the additive is in a range between 0.375 and 0.667.

To achieve the above and other objects according to yet another aspect of the present invention, there is provided an organic EL display device comprising an anode, a hole transporting layer formed on the anode, a light-emitting layer comprising a light-emitting polymer composition including at least first and second light-emitting polymers having elements, wherein the first and second light-emitting polymers have different interfacial characteristics which lower a cohesion between the elements of the first and second light-emitting polymers, and a cathode formed on the light-emitting layer.

A corresponding wavelength spectrum of the first light-emitting polymer overlaps a corresponding wavelength spectrum of the second light-emitting polymer so as to have an energy transfer in the light-emitting polymer composition.

The light-emitting polymer composition further comprises an additive which improves adhesion of the light-emitting composition to a substrate of the organic display device, and lowers the cohesion between the elements of the first and second light-emitting polymers.

To achieve the above and other objects according to still another aspect of the present invention, there is provided an organic EL display device comprising an anode, a hole transporting layer formed on the anode, a light-emitting layer comprising a light-emitting polymer composition including a light-emitting polymer having elements, and an additive which improves adhesion of the light-emitting composition to a substrate and lowers a cohesion between the elements of the light-emitting polymer, and a cathode formed on the light-emitting layer.

BRIEF DESCRIPTION OF THE DRAWINGS

These and other objects and advantages of the present invention will become apparent and more readily appreciated from the following description of the embodiments, taken in conjunction with the accompanying drawings of which.

DETAILED DESCRIPTION OF THE PREFERRED EMBODIMENTS

Figure 1:
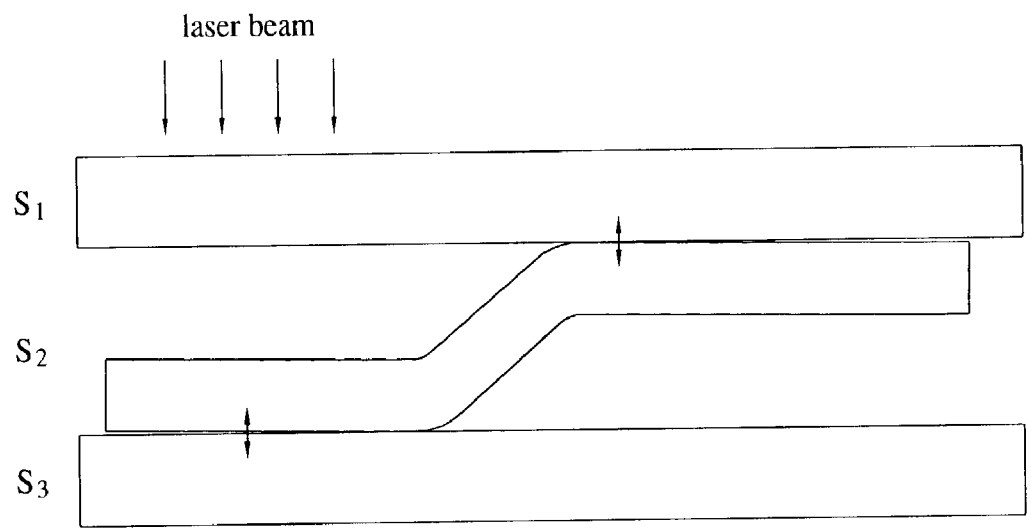
FIG. 1 is a schematic view illustrating a laser transfer operation for patterning a light-emitting layer of a conventional organic EL display device.

Reference will now be made in detail to the embodiments of the present invention, examples of which are illustrated in the accompanying drawings, wherein like reference numerals refer to the like elements throughout. The embodiments are described below in order to explain the present invention by referring to the figures.

A transfer characteristic of a polymer film can be improved by lowering a cohesion between elements of the polymer film and/or raising an adhesion between a substrate and the polymer film.

A light-emitting polymer composition according to an embodiment of the present invention includes at least two kinds of light-emitting polymers having different interfacial properties.

Two kinds of light-emitting polymers having different interfacial properties are mixed to prepare a polymer film. When a laser beam is irradiated to the polymer film, a phase separation occurs. The polymer film begins to transfer to a substrate from a portion of the polymer film in which the phase separation occurs. The phase separation lowers a cohesion between elements of the polymer film without greatly lowering an adhesion between the substrate and the polymer film. Consequently, a transfer characteristic of the polymer film can be improved. As the polymers have a greater difference in interfacial characteristic, the polymer film is transferred more efficiently.

However, when the two kinds of polymers are mixed, a light-emitting efficiency of an organic EL display device may be lowered. Therefore, the light-emitting polymer composition of the present invention has a structure that efficiently performs an energy transfer. That is, an energy received by one polymer (hereinafter, host polymer) is momentarily transferred to the other polymer (hereinafter, a dopant polymer). Therefore, wavelength spectrums of the host polymer and the dopant polymer overlap each other.

For example, a yellow light-emitting polymer, in which a wavelength of absorbed light is relatively small (i.e., has a relatively high energy), receives energy to emit yellow light, and a red light-emitting polymer, in which a wavelength of absorbed light is large (i.e., has a relatively low energy), receives the energy from the yellow light-emitting polymer to finally emit red light. In other words, since the energy transfer occurs momentarily, only the wavelength spectrum of the red light-emitting polymer is finally observed.

The light-emitting polymer composition can be prepared to emit R, G and B colors as well as a single color in the above-described method.

The light-emitting polymer composition may further include an additive which improves the adhesion between the polymer film and the substrate, and simultaneously lowers the cohesion between elements of the polymer film. The additive is "optically inert." That is, the addition of the additive to the light-emitting polymer composition does not affect a final emitting spectrum and a color index of the light-emitting polymer composition in a range of visible light region of 400 nm to 800 nm, wherein the range is a emitting light region of the light-emitting polymer composition.

The additive includes an optically inert polymer, an optically inert small molecular material, a polymer having a carrier transporting ability, or a small molecular material having a carrier transporting ability.

The optically inert polymer includes a polystyrene, a poly (styrene-butadione)copolymer, a polymethylmethacrylate, a polyalphamethylstyrene, a styrene-methylmethacrylate copolymer, a polybutadiene, a polycarbonate, a polyethyleneterephthalate, a polyestersulfonate, a polysulfonate, a polyarylate, a fluorinepolyimide, a transparent fluoric resin, and a transparent acrylic resin. The polymer having the carrier transporting ability includes an arylamine, a perylrene group and a pyrrole-based polymer. The small molecular material having a carrier transporting ability includes one of an arylamine, a hydrazone, a carbazole, a stylbene, a staburst group, and an oxadiazole.

A mixing mass ratio of the two kinds of light-emitting polymers of the light-emitting polymer composition is as follows: 0.3<first polymer<0.8; and 0.2<second polymer<0.7. A mixing mass ratio of the additive is less than 0.7.

A light-emitting polymer composition according to another embodiment of the present invention can include one kind of polymer and an additive. The additive is one of the above-described additives. In this case, since the energy transfer does not occur, a light-emitting efficiency is not improved, but the adhesion between a substrate and a polymer film prepared using the light-emitting polymer composition is improved. A large amount of the additive may reduce the light-emitting efficiency. Accordingly, a mixing mass ratio of the additive in this case is in a range between 0.375 and 0.667.

The mixing mass ratios depend on pattern characteristics and a color purity of a resulting device.

A method of manufacturing an organic EL display device according to the present invention is described below.

A substrate having an anode is cleaned in, for example, an acetone and an isopropylalcohol in sequence and is UV/ozone-treated. A hole transporting layer is, for example, spin-coated on the substrate and then baked. A light-emitting polymer composition of the present invention is deposited on a transfer substrate to tens of nanometers (nm) to thereby form a transfer film. A light-emitting layer having R, G and B color patterns is patterned on the hole transporting layer by using a laser transfer technique. A cathode is formed on the light-emitting layer. Finally, an encapsulating process is performed to complete the organic EL display device.

The organic EL display device of the present invention has an excellent transfer characteristic, thereby forming the light-emitting layer having an edge roughness of less than 5 μm.

Figure 2:
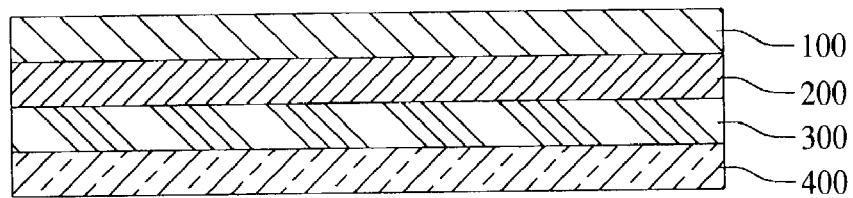
FIG. 2 is a cross-sectional view illustrating an organic EL display device according to an embodiment of the present invention.

FIG. 2 shows a cross-sectional view illustrating an organic EL display device according to the present invention. In FIG. 2, reference numerals 100, 200, 300 and 400 denote a cathode, a light-emitting layer, a hole transporting layer, and an anode, respectively.

Example 1 below describes a light-emitting polymer composition having two kinds of light-emitting polymers and an additive, and an organic EL display device using the same according to the present invention:

EXAMPLE 1

The two kinds of light-emitting polymers and the additive are mixed in an appropriate mass ratio and dissolved in a single solvent to prepare the light-emitting polymer composition. One light-emitting polymer is a PPV-based yellow electrolight-emitting polymer available under the trade name "SUPER YELLOW" from Covion Organic Semiconductors GmbH. The other light-emitting polymer is a PFO-based red electrolight-emitting polymer available under the trade name "RED-B" from Dow Chemical Company. The additive is a polystyrene having a molecular weight of 2,500 available from Sigma-Aldrich Corporation.

The light-emitting polymer composition is sufficiently stirred at a temperature of 60° C. for at least three hours. The light-emitting polymer composition is deposited on a transfer substrate to a thickness 80 nm to thereby form a transfer film. A substrate having an anode electrode pattern is cleaned and then UV/ozone-treated. A hole transporting layer made of a "PEDOT/PSS" from Bayer AG is coated on the substrate to a thickness of 50 nm. The transfer film undergoes a laser transfer technique to thereby form a light-emitting layer of the organic EL display device. A cathode electrode including an LiF layer of 1 nm and an Al layer of 150 nm is formed on the light-emitting layer. Finally, an encapsulating process is performed to complete the organic EL display device.

A mixing mass ratio of the above light-emitting polymer composition which satisfies a Commission Internationale de l'Eclairage (CIE) color coordinate and have an improved transfer characteristic is as follows: 0.3<SUPER YELLOW<0.8, 0.2<RED-B<0.7, and polystyrene <0.7.

One of the optimum mixing mass ratio of the above light-emitting polymer composition is as follows: SUPER YELLOW:RED-B:polystyrene=0.64:0.28:0.08. In this case, a light-emitting efficiency is 1.25 cd/A, and a color coordinate is x=0.66 and y=0.33 (CIE1931, 300 Cd/m$^2$ at a voltage of 6.5 volts).

In the above light-emitting polymer composition, where the organic EL display device emits a red light, which is a finally observed light, SUPER YELLOW is a host polymer and RED-B is a dopant polymer.

Figure 3:
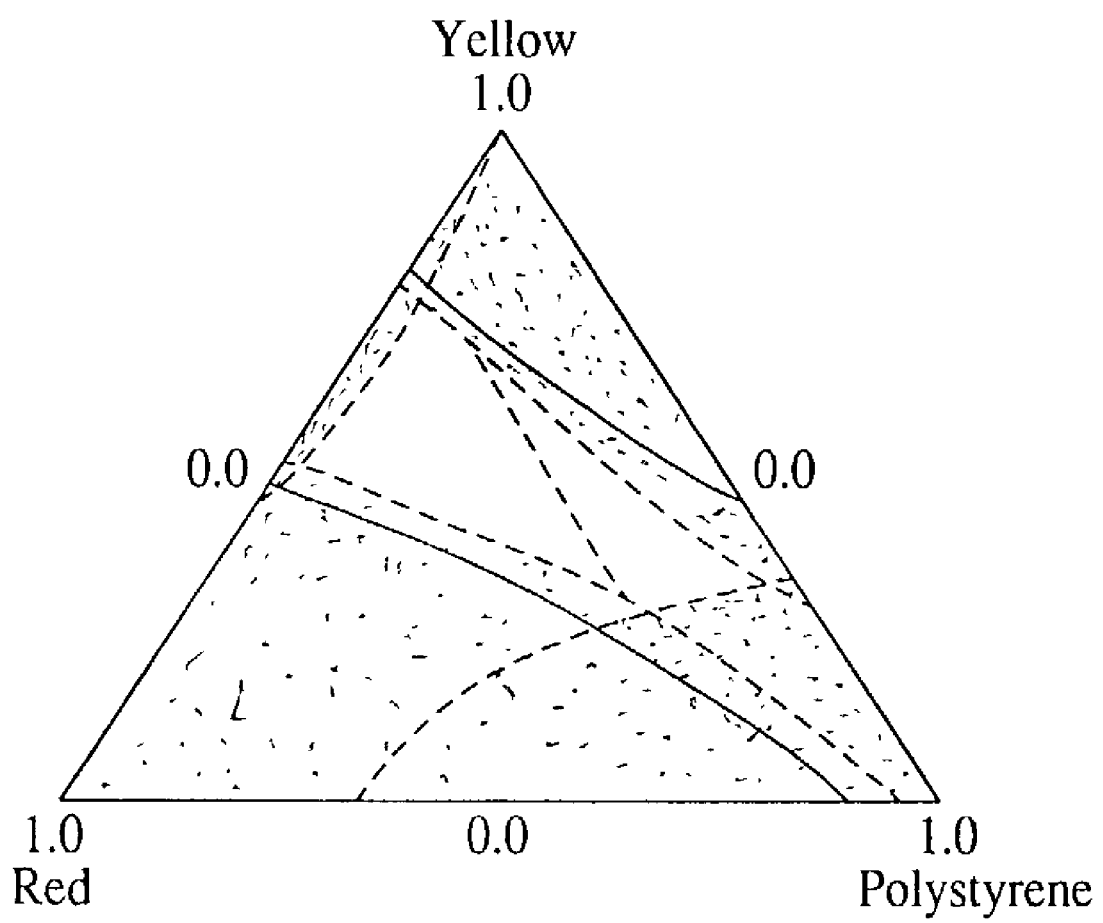
FIG. 3 is a mixing mass ratio graph showing a mixing mass ratio of a light-emitting polymer composition according to the present invention.

FIG. 3 shows a mixing mass ratio graph of a light-emitting polymer composition of the present invention which satisfies a CIE color coordinate and have an improved transfer characteristic. A non-dotted region (a region not filled with dots) is a feasible region that can satisfy the CIE coordinate and has the laser transfer characteristic.

Figure 4:
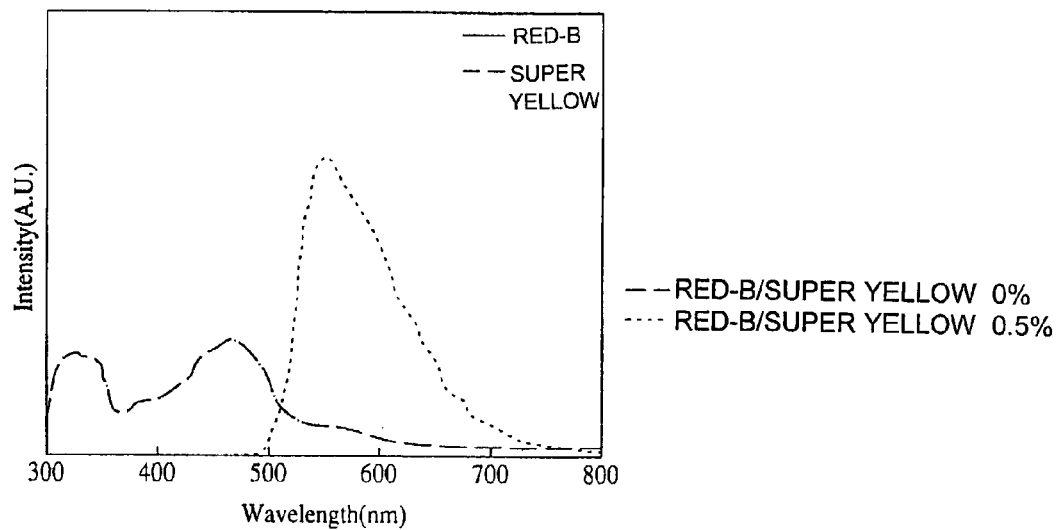
FIG. 4 is a graph illustrating a wavelength spectrum of the organic EL display device of FIG. 2 having a light-emitting polymer composition of the present invention.

FIG. 4 shows a graph illustrating a wavelength spectrum of an organic EL display device according to the present invention. As shown in FIG. 4, a wavelength spectrum of emitted light overlaps a wavelength spectrum of absorbed light in a wavelength range between 500 nm and 700 nm. Therefore, an energy transfer from i.e., SUPER YELLOW to RED-B occurs momentarily, so that only a wavelength spectrum of red light is observed.

Figure 5:
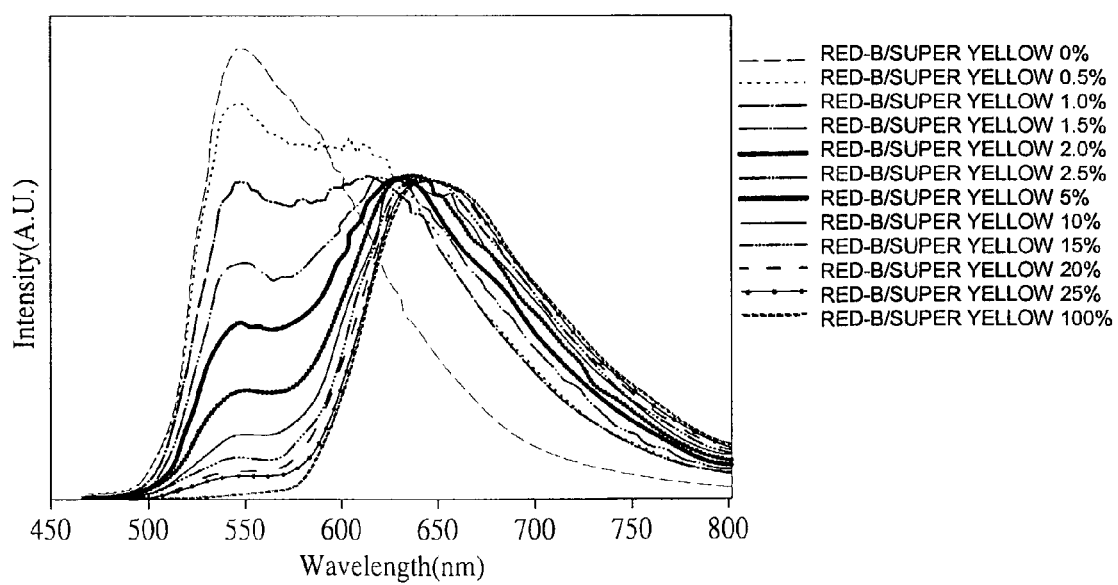
FIG. 5 is a graph illustrating a wavelength spectrum of the organic EL display device of FIG. 2 according to variations of a mixing mass ratio of the light-emitting polymer composition.

FIG. 5 shows a graph illustrating a wavelength spectrum of an organic EL display device of the present invention according to variations of a mixing mass ratio of a light-emitting polymer composition used in the organic EL display device.

As shown in FIG. 5, a wavelength spectrum of an organic EL display device having a mixing mass ratio of RED-B of 25% is almost identical to that of where a mixing mass ratio of RED-B is 100%.

Figure 6:
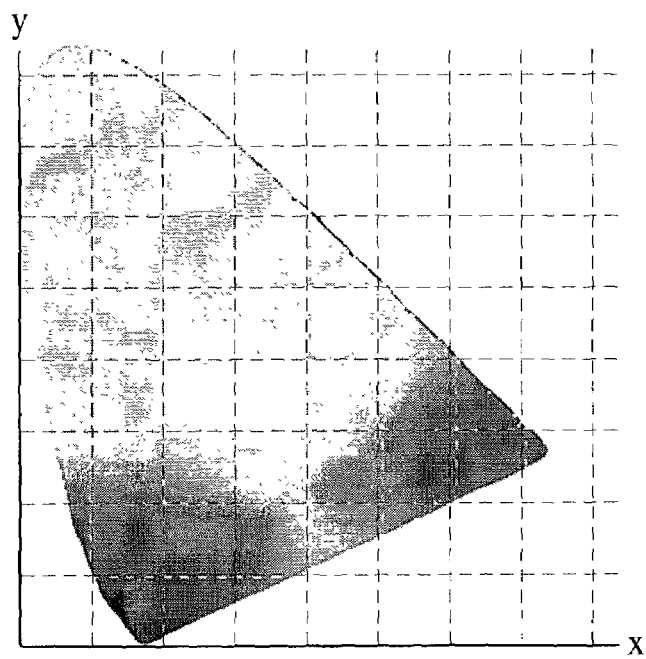
FIG. 6 is a CIE color coordinate of the organic EL display device having a mixing mass ratio of SUPER YELLOW: RED-B:polystyrene=0.64:0.28:0.08, respectively, according to the present invention.
Figure 7:
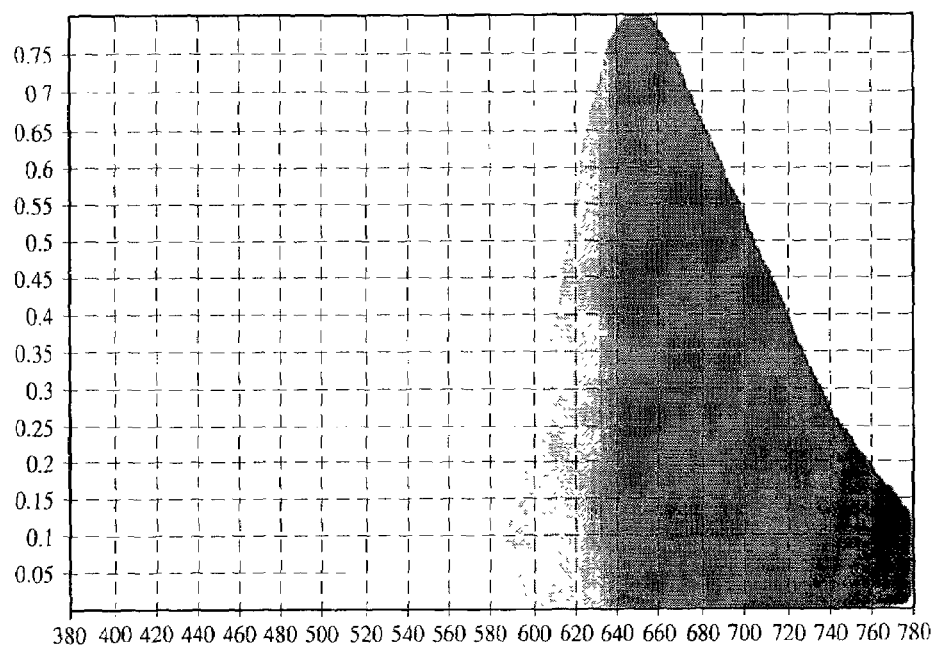
FIG. 7 is a wavelength spectrum of the organic EL display device of FIG. 6 having the light-emitting polymer composition of the present invention.

FIGS. 6 and 7 show a CIE color coordinate and a wavelength spectrum of an organic EL display device having a light-emitting polymer composition with a mixing mass ratio of SUPER YELLOW:RED-B:polystyrene=0.64:0.28:0.08, respectively.

Example 2 below describes a light-emitting polymer composition having one light-emitting polymer and an additive, and an organic EL display device using the same according to the present invention.

EXAMPLE 2

The light-emitting polymer is a red electrolight-emitting polymer available under the trade name "AEF 2009 & 2045" from Covion Organic Semiconductors GmbH. The additive is a polystyrene available from Sigma-Aldrich Corporation. The molecular weight of the polystyrene is in a range between 2,000 and 2,500. The closer the molecular weight of the polystyrene is to 2,000, better the edge roughness of the light-emitting layer.

The light-emitting polymer and the additive are mixed in an appropriate mixing mass ratio and dissolved in a toluene to prepare the light-emitting polymer composition.

The light-emitting polymer composition is sufficiently stirred at a temperature of 60° C. for at least three hours. The light-emitting polymer composition is deposited on a transfer substrate to a thickness 80 nm to thereby form a transfer film. A substrate having an anode is cleaned and then UV/ozone-treated for fifteen minutes. A hole transporting layer made of "PEDOT/PSS" from Bayer AG is coated on the substrate to a thickness of 50 nm. The transfer film undergoes a laser transfer technique to thereby form a light-emitting layer of the organic EL display device. A cathode electrode is formed on the light-emitting layer. Finally, an encapsulating process is performed to complete the organic EL display device.

The mixing mass ratio of the light-emitting polymer composition is as follows: 0.333<AEF 2009 or 2045<0.675, and 0.375<polystyrene<0.667. The light-emitting layer has an edge roughness of less than 5 μm.

Tables 1 and 2 below show the light emitting efficiency and the CIE color coordinate of the organic EL display device manufactured in the above-described condition.

An organic EL display device of Table 1 has the following structure: substrate having anode/hole transporting layer of 50 nm/AEF2009:polystyrene(1:1)/cathode having a Ca layer of 30 nm and an Ag layer of 250 nm.

TABLE 1

| | Spin-coating speed | Thickness | Turn-on voltage | Voltage (V) at 100 | Efficiency at 100 | CIE (1931) | |
|---|---|---|---|---|---|---|---|
| | (rpm) | (Å) | (V) | Cd/ | Cd/ | X | Y |
| CR/PS (#1) | 2000 | 800 | 4.5 | 7.5 | 0.78 | 0.6601 | 0.3383 |
| CR/PS (#2) | 2000 | 800 | 4.0 | 7.0 | 0.83 | 0.6628 | 0.3354 |
| CR/PS (#3) | 2000 | 800 | 4.0 | 6.5 | 0.77 | 0.6605 | 0.3376 |

An organic EL display device of Table 2 has the following structure: substrate having anode/hole transporting of 50 nm/AEF2045:polystyrene(1:2)/cathode having a Ca layer of 30 nm and a Ag layer of 250 nm.

TABLE 2

| | Thickness | Turn-on voltage | Voltage (V) at 100 | Efficiency at 100 | CIE (1931) | |
|---|---|---|---|---|---|---|
| | (Å) | (V) | Cd/ | Cd/ | x | Y |
| CR/PS (#1) | 700 | 3.5 | 5.5 | 0.79 | 0.6658 | 0.3342 |
| CR/PS (#2) | 800 | 3.5 | 6.0 | 1.34 | 0.6682 | 0.3309 |
| CR/PS (#3) | 850 | 3.5 | 6.5 | 1.22 | 0.6682 | 0.3309 |
| CR/PS (#4) | 900 | 4.0 | 7.0 | 0.51 | 0.6675 | 0.3316 |

According to the present invention, a transfer characteristic of a light-emitting layer of an organic EL display device, formed using a laser transfer technique, is improved. Accordingly, a resulting pattern of the light-emitting layer is improved. In addition, the organic EL display device of the present invention shows an improved light-emitting efficiency, as compared to a conventional, i.e., pure red light-emitting polymer in the same luminance condition.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. An organic electroluminescent (EL) display device, comprising:
a light-emitting layer having an edge roughness of less than 5 μm and comprising a light-emitting polymer composition including:
first and second light-emitting polymers having chemical elements, wherein:
the first and second light-emitting polymers have different interfacial characteristics which lower a cohesion between the chemical elements of the first and second light-emitting polymers, and a corresponding wavelength spectrum of the first light-emitting polymer overlaps a corresponding wavelength spectrum of the second light-emitting polymer, so as to allow an energy transfer in the light-emitting polymer composition; and
an additive which improves adhesion of the light-emitting polymer composition to a substrate and lowers the cohesion between the chemical elements of the first and second light-emitting polymers,
wherein the additive is a small molecular material having a carrier transporting ability, and the small molecular material having the carrier transporting ability is one of a hydrazone, a carbazole, a stilbene, and a starburst group.

2. The device of claim 1, wherein:
the first light-emitting polymer of the light-emitting polymer composition has a mixing mass ratio in a range between 0.3 and 0.8, and
the second light-emitting polymer of the light-emitting polymer composition has a mixing mass ratio in a range between 0.2 and 0.7.

3. The device of claim 1, wherein the additive of the light-emitting polymer composition has a mixing mass ratio of less than 0.7.

4. The device of claim 1, wherein the light-emitting polymer composition further comprises a polymer having a carrier transporting ability which includes a perylene group and a pyrrole-based polymer.

5. An organic electroluminescent (EL) display device, comprising:
a light-emitting layer having an edge roughness of less than 5 μm and comprising a light-emitting polymer composition including:
a light-emitting polymer having chemical elements; and
an additive which improves adhesion of the light-emitting polymer composition to a substrate and lowers a cohesion between the chemical elements of the light-emitting polymers, wherein the additive is a small molecular material having a carrier transporting ability, and the small molecular material having the carrier transporting ability is one of a hydrazone, a carbazole, a stilbene, and a starburst group.

6. The device of claim 5, wherein the additive of the light-emitting polymer composition has a mixing mass ratio in a range between 0.375 and 0.667.

7. The device of claim 5, wherein the light-emitting polymer composition further comprises a polymer having a carrier transporting ability which includes a perylene group and a pyrrole-based polymer.

8. An organic EL display device comprising:
an anode;
a hole transporting layer on the anode;
a light-emitting layer comprising a light-emitting polymer composition including:
a light-emitting polymer having chemical elements, and
an additive which improves adhesion of the light-emitting composition to a substrate and lowers a cohesion between the chemical elements of the light-emitting polymer, wherein the additive is one of an optically inert polymer or an optically inert small molecular material; and
a cathode formed on the light-emitting layer,
wherein the optically inert polymer is selected from a group consisting of a polystyrene, a poly(styrene-butadione) copolymer, a polymethylmethacrylate, a polyalphamethylstyrene, a styrene-methylmethacrylate copolymer, a polybutadiene, a polycarbonate, a polyethylene terephthalate, a polyester sulfonate, a polysulfonate, a polyarylate, a fluorinepolyimide, a transparent fluoric resin, and a transparent acrylic resin,
wherein the optically inert small molecular material having a carrier transporting ability is one of a hydrazone, a carbazole, a stilbene, and a starburst group, and
wherein the light-emitting layer has an edge roughness of less than 5 μm.

9. The device of claim 8, wherein the additive has a mixing mass ratio in a range between 0.375 and 0.667.

10. The device of claim 8, further comprising a polymer having a carrier transporting ability which includes a perylene group and a pyrrole-based polymer.

11. An organic electroluminescent (EL) display device, comprising:
a light-emitting layer having an edge roughness of less than 5 μm and comprising a light-emitting polymer composition including:
first and second light-emitting polymers having chemical elements, wherein:
the first and second light-emitting polymers have different interfacial characteristics which lower a cohesion between the chemical elements of the first and second light-emitting polymers, and
a corresponding wavelength spectrum of the first light-emitting polymer overlaps a corresponding wavelength spectrum of the second light-emitting polymer, so as to allow an energy transfer in the light-emitting polymer composition; and
an additive which improves adhesion of the light-emitting polymer composition to a substrate and lowers the cohesion between the chemical elements of the first and second light-emitting polymers,
wherein the additive is one of an optically inert polymer, or an optically inert low-molecular weight material.

12. The device of claim 11, wherein:
the first light-emitting polymer of the light-emitting polymer composition has a mixing mass ratio in a range between 0.3 and 0.8, and
the second light-emitting polymer of the light-emitting polymer composition has a mixing mass ratio in a range between 0.2 and 0.7.

13. The device of claim 11, wherein the additive of the light-emitting polymer composition has a mixing mass ratio of less than 0.7.

14. An organic electroluminescent (EL) display device, comprising:

a light-emitting layer having an edge roughness of less than 5 µm and comprising a light-emitting polymer composition including:
- a light-emitting polymer having chemical elements; and
- an additive which improves adhesion of the light-emitting polymer composition to a substrate and lowers a cohesion between the chemical elements of the light-emitting polymer,
  - wherein the additive is one of an optically inert polymer, an optically inert small molecular material, or a small molecular material having a carrier transporting ability, and
- the small molecular material having the carrier transporting ability is one of a hydrazone, a carbazole, a stilbene, or a starburst group.

15. The device of claim 14, wherein the additive of the light-emitting polymer composition has a mixing mass ratio in a range between 0.375 and 0.667.

16. An organic EL display device comprising:
an anode;
a hole transporting layer on the anode;
a light-emitting layer comprising a light-emitting polymer composition including:
a light-emitting polymer having elements, and
an additive which improves adhesion of the light-emitting composition to a substrate and lowers a cohesion between the elements of the light-emitting polymer, wherein the additive is one of an optically inert polymer, an optically inert small molecular material, or a small molecular material having a carrier transporting ability; and
a cathode formed on the light-emitting layer,
wherein the small molecular material having the carrier transporting ability is one of a hydrazone, a carbazole, a stilbene, or a starburst group, and
wherein the light-emitting layer has an edge roughness of less than 5 µm.

17. The device of claim 16, wherein the additive has a mixing mass ratio in a range between 0.375 and 0.667.

18. An organic electroluminescent (EL) display device, comprising:
a light-emitting layer having an edge roughness of less than 5 µm and comprising a light-emitting polymer composition including:
light-emitting polymers which have different interfacial characteristics that lower a cohesion between chemical elements of the light-emitting polymers, and corresponding wavelength spectrums that overlap so as to allow an energy transfer in the light-emitting polymer composition, and
an additive which improves adhesion of the light-emitting polymer composition to a substrate and lowers the cohesion between the chemical elements of the light-emitting polymers, wherein the additive comprises a small molecular material having a carrier transporting ability and is selected from a group of a hydrazone, a carbazole, a stilbene, or a starburst group.

* * * * *

UNITED STATES PATENT AND TRADEMARK OFFICE
CERTIFICATE OF CORRECTION

PATENT NO. : 7,482,066 B2
APPLICATION NO. : 10/172001
DATED : January 27, 2009
INVENTOR(S) : Mu-Hyun Kim et al.

Page 1 of 1

It is certified that error appears in the above-identified patent and that said Letters Patent is hereby corrected as shown below:

Column 9, line 56, change "polymers" to --polymer--.

Signed and Sealed this

Twenty-fourth Day of March, 2009

JOHN DOLL
*Acting Director of the United States Patent and Trademark Office*